(12) United States Patent
Choi et al.

(10) Patent No.: US 7,605,473 B2
(45) Date of Patent: Oct. 20, 2009

(54) NONVOLATILE MEMORY DEVICES

(75) Inventors: Jung-Dal Choi, Gyeonggi-do (KR); Yun-Seung Shin, Seoul (KR); Jong-Sun Sel, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 217 days.

(21) Appl. No.: 11/403,964

(22) Filed: Apr. 13, 2006

(65) Prior Publication Data

US 2006/0234447 A1    Oct. 19, 2006

(30) Foreign Application Priority Data

Apr. 14, 2005    (KR)    ...................... 10-2005-0031153

(51) Int. Cl.
*H01L 21/336*    (2006.01)
(52) U.S. Cl. ...................... 257/773; 438/210; 438/211; 257/315
(58) Field of Classification Search .................. 438/201, 438/211
See application file for complete search history.

(56) References Cited

U.S. PATENT DOCUMENTS

| | | | | |
|---|---|---|---|---|
| 5,364,817 A | * | 11/1994 | Lur et al. | ...................... 438/644 |
| 5,545,575 A | * | 8/1996 | Cheng et al. | ................. 438/304 |
| 6,090,667 A | * | 7/2000 | Hara | ........................... 438/258 |

* cited by examiner

*Primary Examiner*—Leonardo Andújar
(74) *Attorney, Agent, or Firm*—Myers Bigel Sibley & Sajovec

(57) ABSTRACT

Methods of fabricating nonvolatile memory devices are provided. An isolation layer is formed on a substrate. The substrate has a memory region and a well contact region and the isolation layer defines an active region of the substrate. A gate insulating layer is formed on the active region. The gate insulating layer is patterned to define an opening therein. The opening exposes at least a portion of the well contact region of the substrate and acts as a charge pathway for charges generated during a subsequent etch of the isolation layer. Related memory device are also provided.

5 Claims, 31 Drawing Sheets

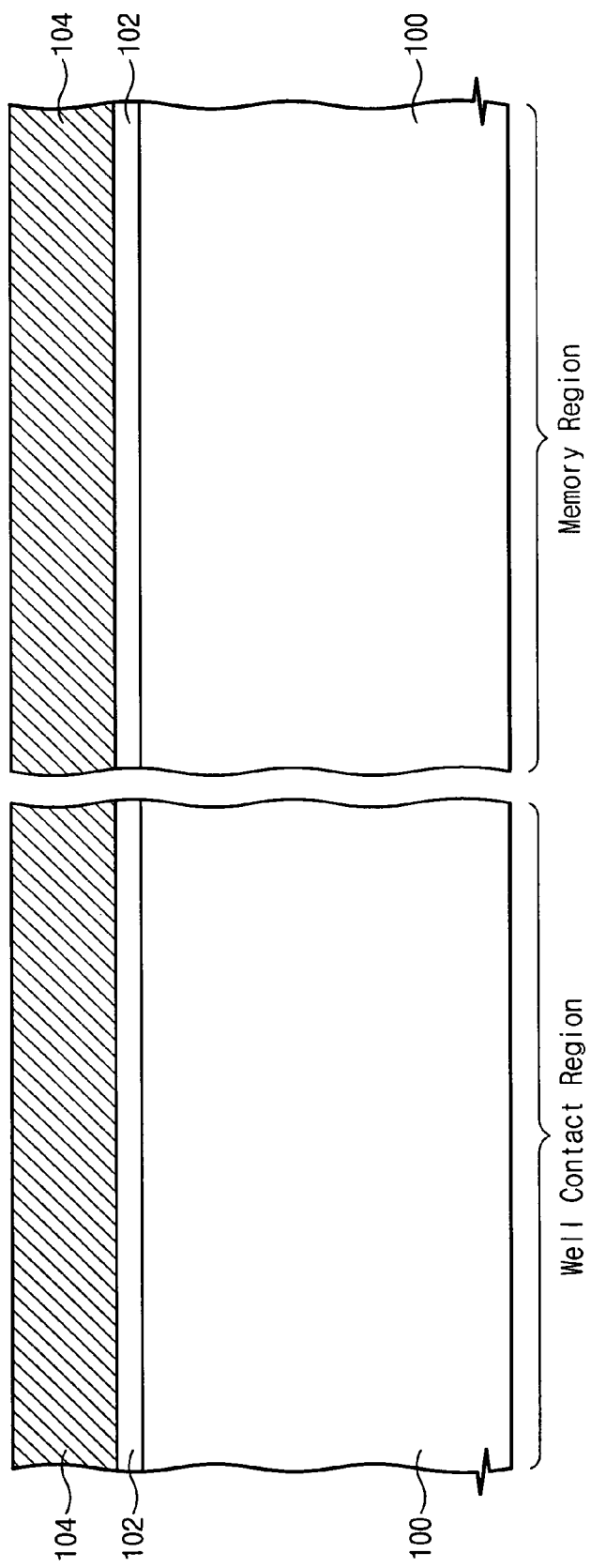

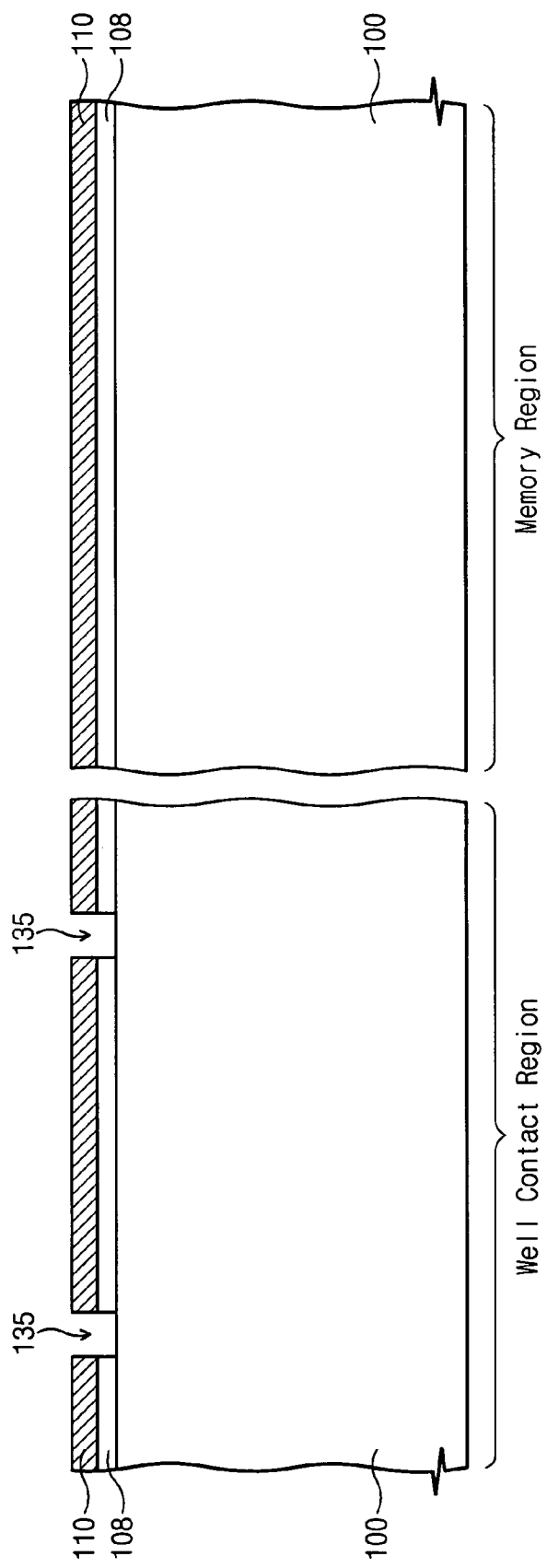

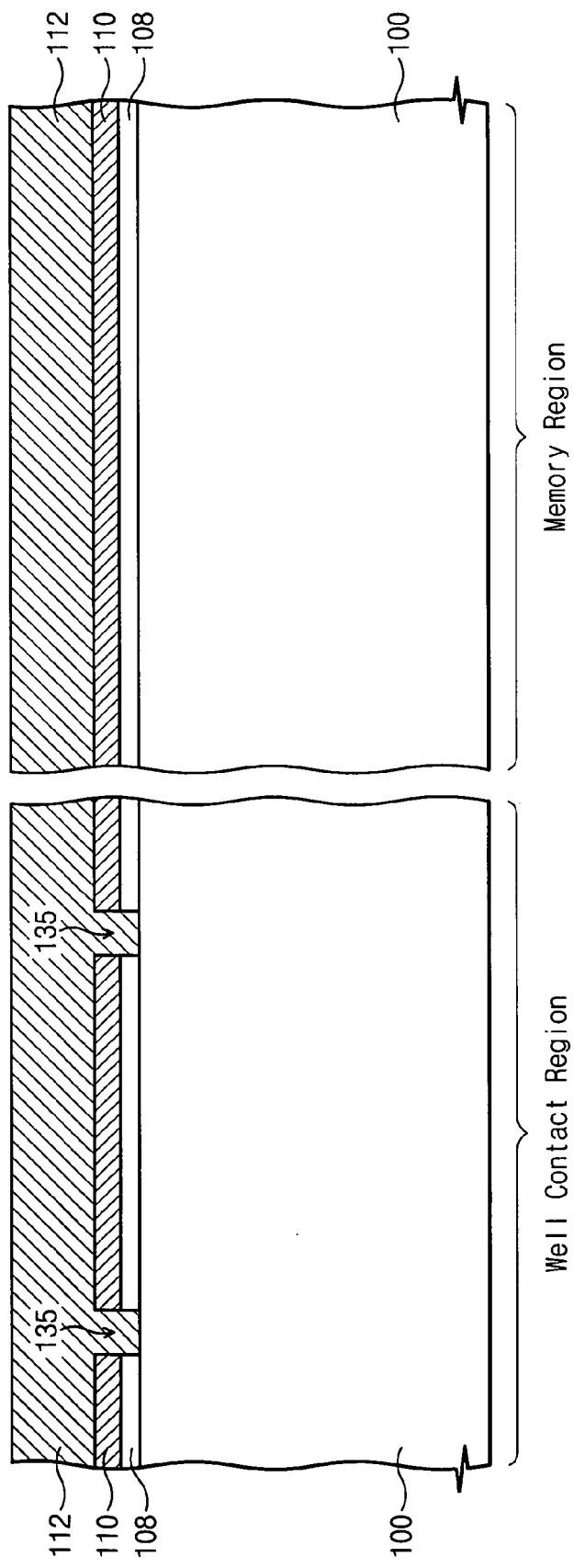

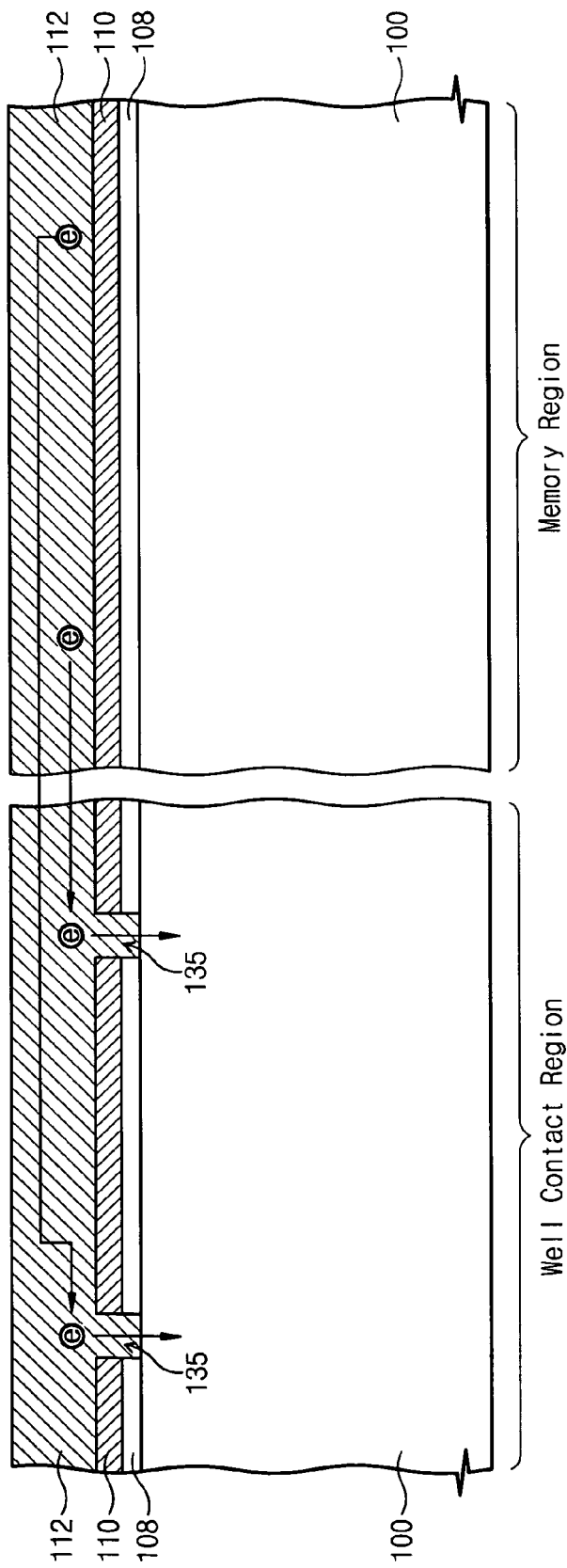

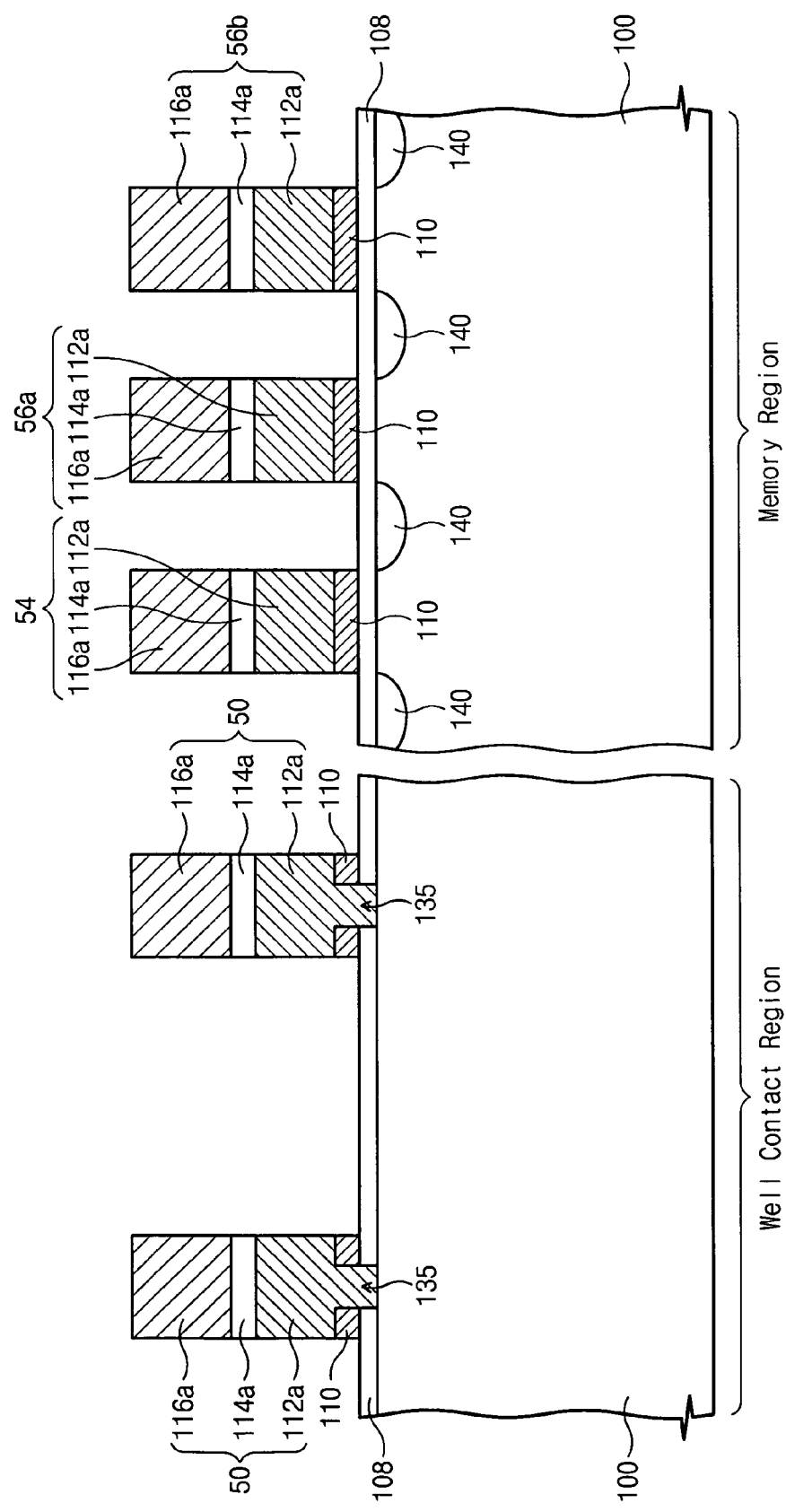

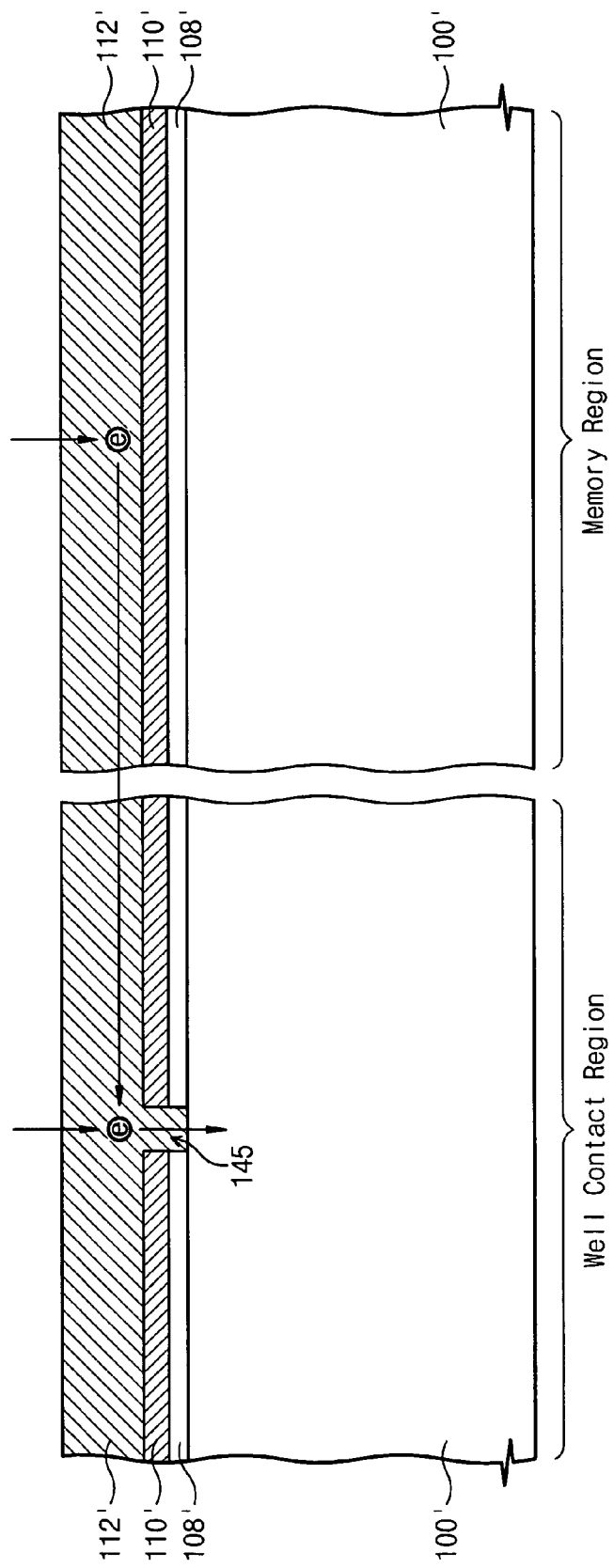

NONVOLATILE MEMORY DEVICES

CLAIM OF PRIORITY

This application is related to and claims priority from Korean Patent Application No. 10-2005-0031153, filed on Apr. 14, 2005 in the Korean Intellectual Property Office, the disclosure of which is hereby incorporated herein by reference as if set forth in its entirety.

FIELD OF THE INVENTION

The present invention relates to semiconductor devices and methods of fabricating the same, and more particularly, to nonvolatile memory devices and methods of fabricating the same.

BACKGROUND OF THE INVENTION

Generally, nonvolatile memory devices are configured to store and erase data electrically and retain the stored data even if a power supply to the memory device is interrupted. Nonvolatile memory devices typically have a stacked gate electrodes including a gate insulating layer, a floating gate, a dielectric layer and a control gate sequentially stacked gate structure on an active region of a substrate. In order to easily program and/or erase data from the memory device a coupling ratio should typically be high. The coupling ratio may be represented as a ratio between a voltage applied to the control gate and a voltage induced to the floating gate. Typically, the coupling ratio may be increased by having the dielectric layer and the control gate be adjacent to a side surface as well as a upper surface of the floating gate.

Referring to FIGS. 1A to 1C, cross-sections of memory devices illustrating conventional methods of increasing the coupling ratio will be discussed. As illustrated in FIG. 1A, an active region is defined on a substrate 10 by an isolation layer 16. A gate insulating layer 12 and a floating gate pattern 14 are formed on the active region. The side surface of the floating gate pattern 14 is exposed by etching the isolation layer 16 in order to possibly increase the coupling ratio. At this time, the etching of the isolation layer 16 may be performed using, for example, a dry etching process, a wet etching process, or the like. When a wet etching process having isotropic etching characteristic is used, the gate insulating layer 12 may be also etched during the wet etching process used to expose the side surface of the floating gate pattern 14.

Therefore, the isolation layer 16 is etched using a two step process. Referring first to FIG. 1B, a first etching process may be performed using, for example, a dry or wet etching process, on the isolation layer 16*a*until at least a portion of the gate insulating layer 12 is exposed. As illustrated in FIG. 1C, a second etching process is performed using a dry etching process having anisotropic etching characteristic in order to etch the isolation layer 16*b*around the gate insulating layer 12. In this case, however, charges generated due to plasma, which may be used as an etchant during the dry etching process, may be accumulated in the floating gate pattern 14. Furthermore, because of a strong electric field due to the accumulated charges, a breakdown may be induced in the thin gate insulating layer 12. This breakdown in the gate insulating layer 12 may be detrimental to the characteristics of a transistor, which may cause instability in the operation of the nonvolatile memory device.

SUMMARY OF THE INVENTION

Some embodiments of the present invention provide methods of fabricating nonvolatile memory devices. An isolation layer is formed on a substrate. The substrate has a memory region and a well contact region and the isolation layer defines an active region of the substrate. A gate insulating layer is formed on the active region. The gate insulating layer is patterned to define an opening therein. The opening exposes at least a portion of the well contact region of the substrate and acts as a charge pathway for charges generated during a subsequent etch of the isolation layer.

In further embodiments of the present invention, a first conductive layer may be formed on the gate insulating layer. The isolation layer may be selectively etched to expose at least a portion of a side surface of the first conductive layer.

In still further embodiments of the present invention, a dielectric layer may be formed on the first conductive layer. A second conductive layer may be formed on the dielectric layer. The dielectric layer and the first and second conductive layers may be patterned to provide stacked gate electrodes on the memory region and the well contact region of the substrate. In some embodiments, the opening is under the stacked gate electrode formed on the well contact region and electrically couples the first conductive layer and the substrate. In further embodiments, the opening is outside of the stacked gate electrode formed on the well contact region.

In some embodiments of the present invention, a buffer conductive layer may be formed on the gate insulating layer. The buffer conductive layer may be patterned to define the opening in the gate insulating layer and the buffer conductive pattern.

In further embodiments of the present invention, the isolation layer may be etched until a surface of the isolation layer is substantially planar with an upper surface of the first conductive layer. Then, the isolation layer may be etched until the side surface of the first conductive layer is exposed. The etching of the isolation layer until the side surface of the first conductive layer is exposed may include an anisotropic dry etching process.

Although embodiments of the present invention are discussed above primarily with respect to method embodiments, related devices are also discussed herein.

BRIEF DESCRIPTION OF THE DRAWINGS

FIGS. 3A to 11A are cross-sections taken along the line A-A' of FIG. 2 illustrating processing steps in the fabrication of nonvolatile memory devices according to some embodiments of the present invention.

FIGS. 3B to 11B are cross-sections taken along the line B-B' of FIG. 2 illustrating processing steps in the fabrication of nonvolatile memory devices according to the some embodiments of the present invention.

FIGS. 13A to 16A are cross-sections taken along the line A-A' of FIG. 12 illustrating processing steps in the fabrication of nonvolatile memory devices according to further embodiments of the present invention.

FIGS. 13B to 16B are cross-sections taken along the line B-B' of FIG. 12 illustrating processing steps in the fabrication of nonvolatile memory devices according to further embodiments of the present invention.

DETAILED DESCRIPTION OF EMBODIMENTS OF THE PRESENT INVENTION

Figure 1A:
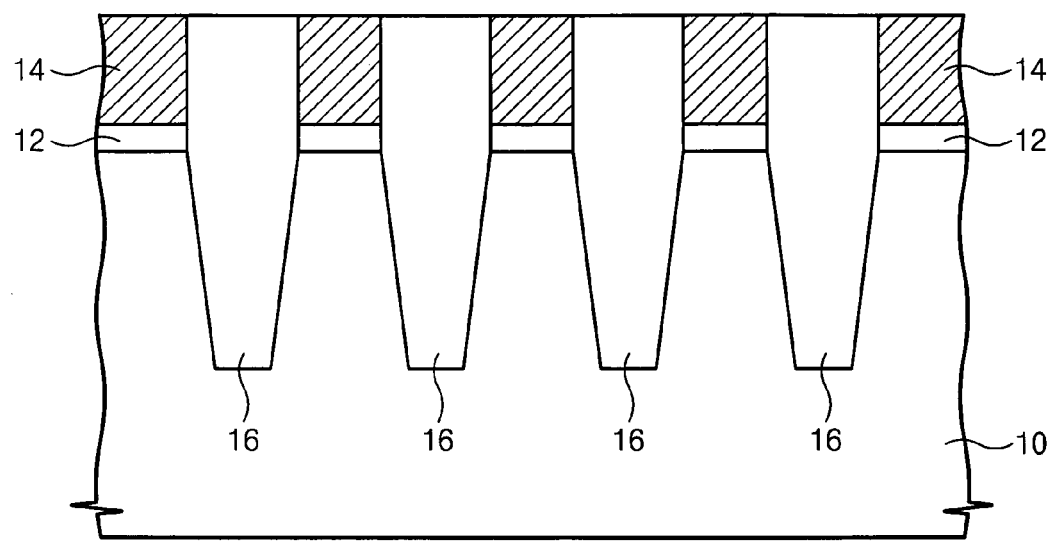
FIGS. 1A to 1C are cross-sections illustrating conventional methods of increasing a coupling ratio.
Figure 1B:
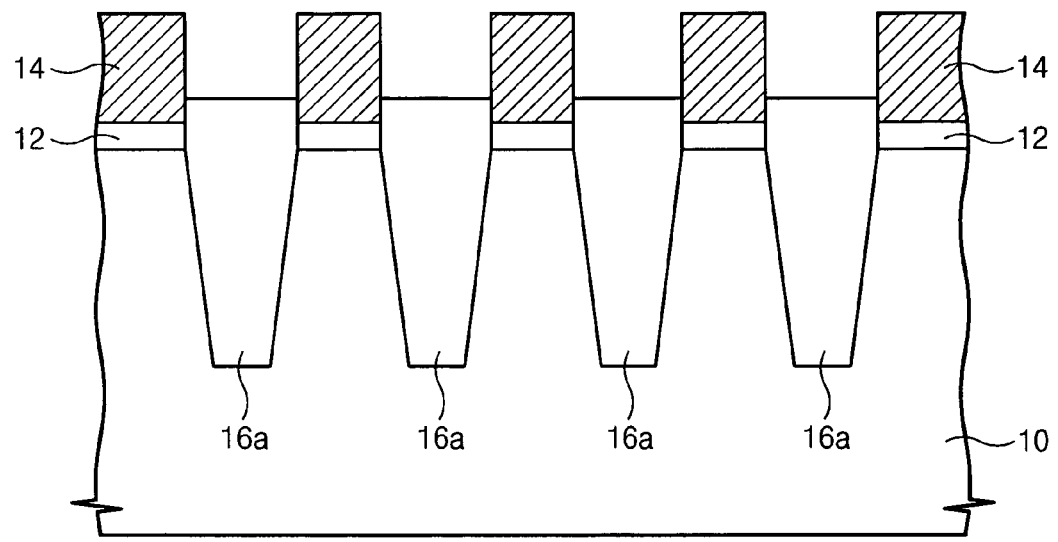
Figure 1C:
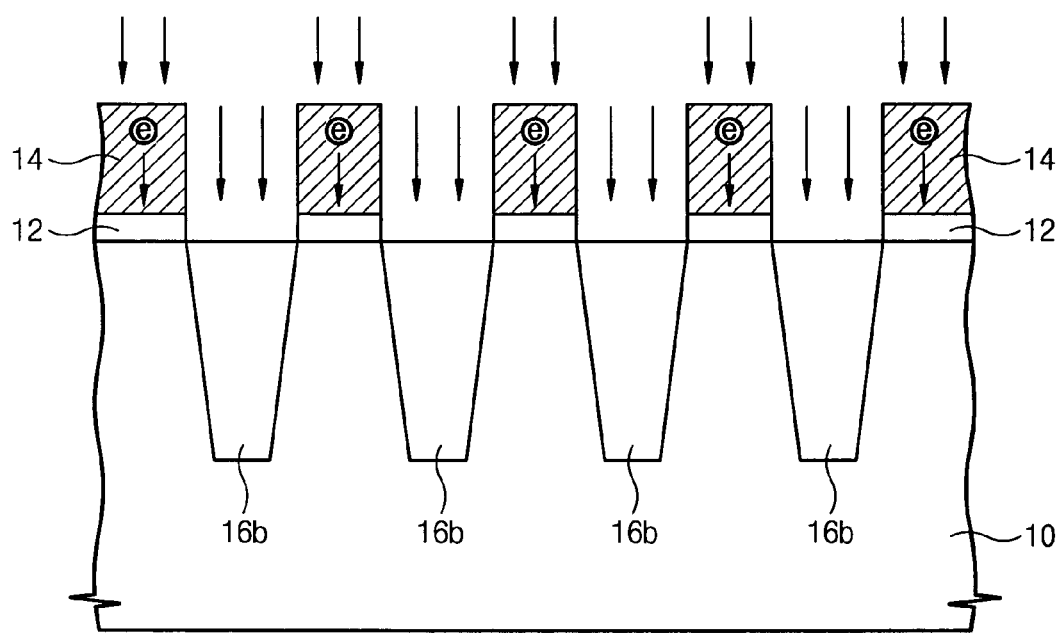

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Like numbers refer to like elements throughout.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the precise shape of a region of a device and are not intended to limit the scope of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
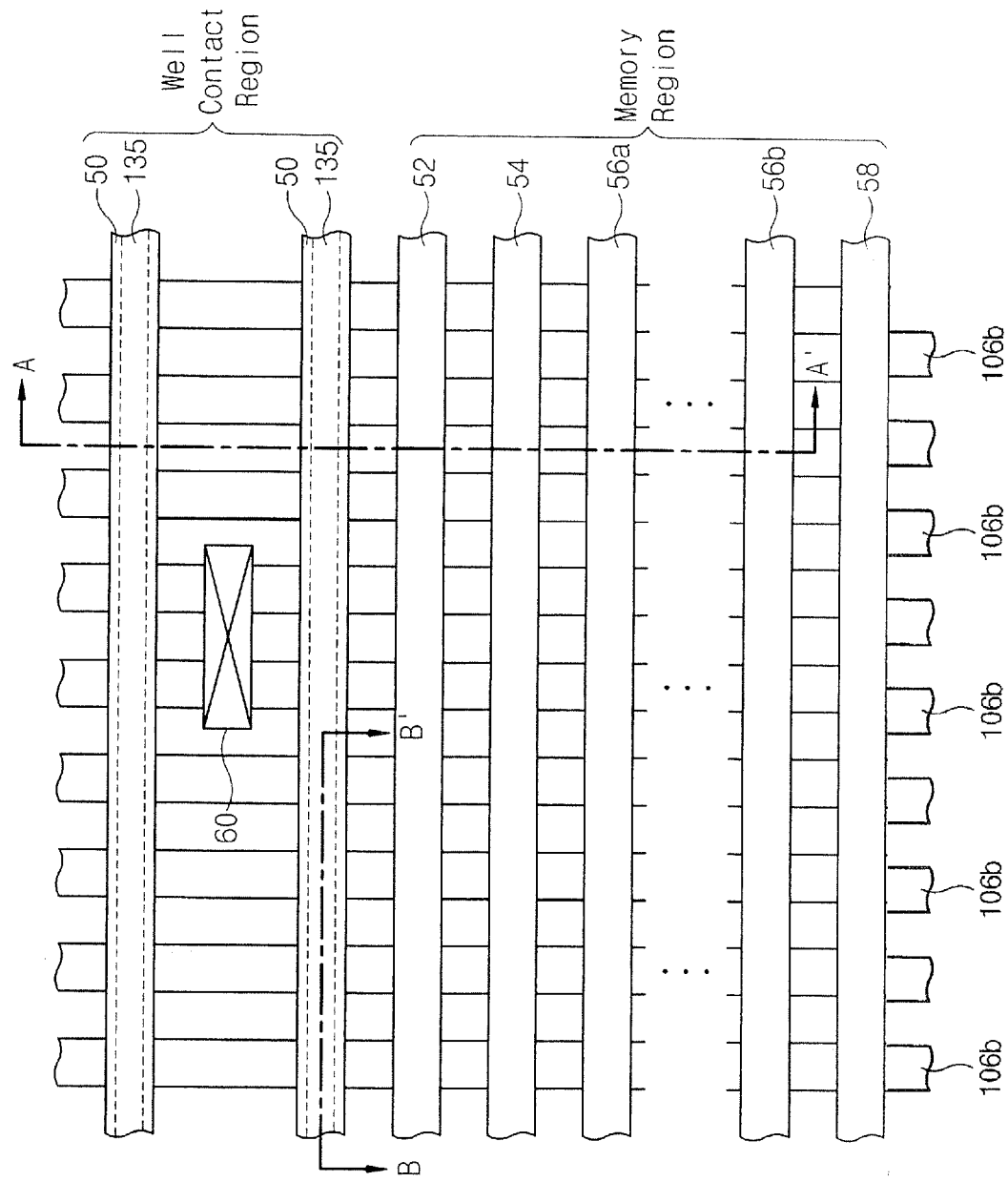
FIG. 2 is a plan view of nonvolatile memory devices according to some embodiments of the present invention.

Referring first to FIG. 2, a plan view of nonvolatile memory devices according to some embodiments of the present invention will be discussed. As illustrated in FIG. 2, a substrate includes a well contact region and a memory region. As used herein, the memory region refers to the portion of the substrate that will be used for a memory cell. The memory region is formed by, for example, arranging a ground select line 54, a plurality of word lines 56a and 56b, and a string select line 58 on the substrate. The ground select line 54, the plurality of the word lines 56a and 56b, and the string select line 58 cross a plurality of active regions defined by isolation layers 106b. The isolation layers 106b are aligned on the substrate in parallel with one another. A source region of the ground select line 54 is electrically coupled to a common source line 52.

The well contact region includes a well contact 60 and a dummy gate line 50. The well contact 60 is configured to apply a well bias voltage to the substrate. A plurality of well contacts 60 may be formed in order to decrease resistance. The well contact 60 may include a gate pattern additionally formed on the well contact region in order to reduce the likelihood of interference with the lines 52, 54, 56a, 56b and 58 arranged on the memory region during a patterning process as the spaces between the lines 52, 54, 56a, 56b and 58 are typically not equal to the spaces where the well contact 60 is formed. Although in some embodiments of the present invention, the dummy gate lines 50 may be configured as the same structure as those of the plurality of the word lines 56a and 56b in the memory region, they do not operate as the memory cell.

In some embodiments of the present invention, an opening 135 is formed under the dummy gate line 50 so as to reduce the likelihood that charges generated in etching the isolation layer 106b will accumulate at a floating gate pattern. Methods of fabricating nonvolatile memory devices will be discussed below.

Referring now to FIGS. 3A through 11B, cross-sections illustrating processing steps in the fabrication of nonvolatile memory device according to some embodiments of the present invention will be discussed. FIGS. 3A through 11A are cross-sections taken along the line A-A' of FIG. 2 and FIGS. 3B through 11B are cross-sections taken along the line B-B' of FIG. 2.

Figure 3A:
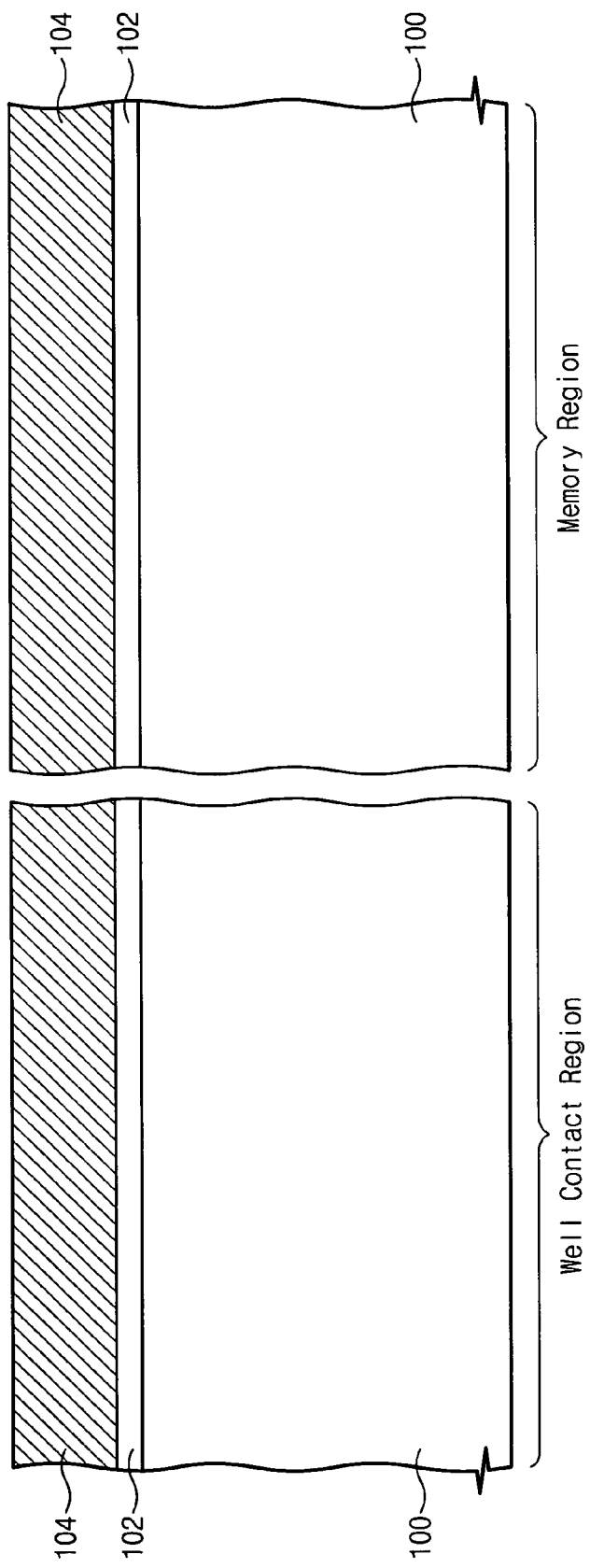
Figure 3B:
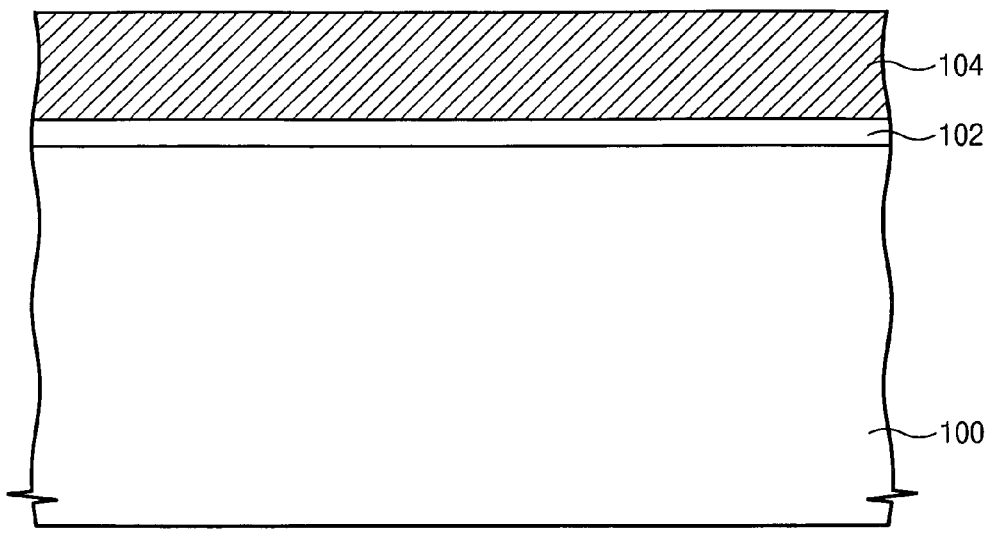

As illustrated in FIGS. 3A and 3B, a pad oxide layer 102 is formed on the substrate 100 and a pad nitride layer 104 is formed on the pad oxide layer. The pad oxide layer 102 and the pad nitride layer 104 are used as an etch mask for forming a trench in the substrate 100.

Figure 4B:
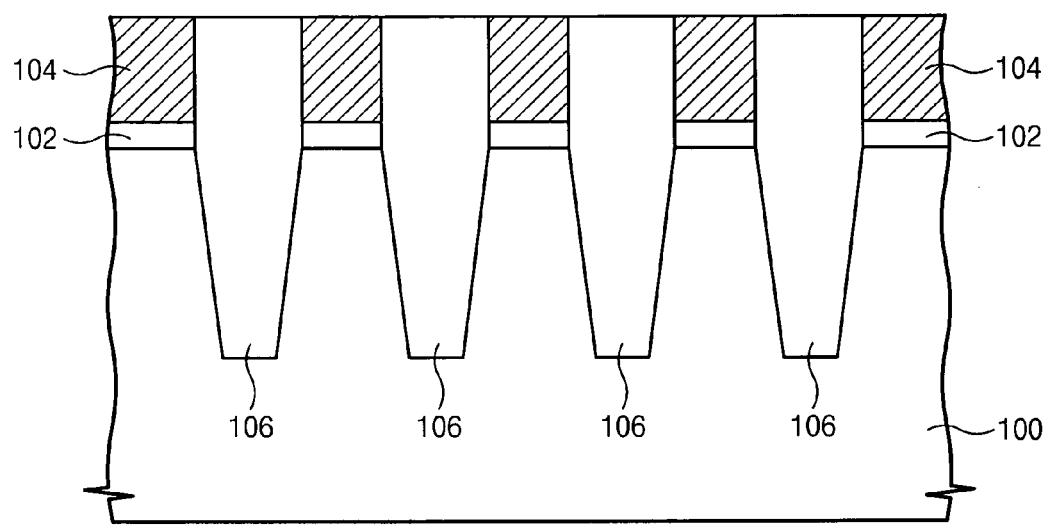

Referring now to FIGS. 4A and 4B, a photoresist pattern (not shown) is formed on the pad nitride layer 104. The pad nitride layer 104, the pad oxide layer 102 and the substrate 100 are etched in sequence to form the trench therein. After depositing a high density plasma (HDP) oxide layer for a trench insulating layer in the trench, a chemical mechanical polishing (CMP) process is performed for planarizing a top surface thereof, to thereby form an isolation layer 106, which defines the active region of the substrate 100.

Figure 5A:
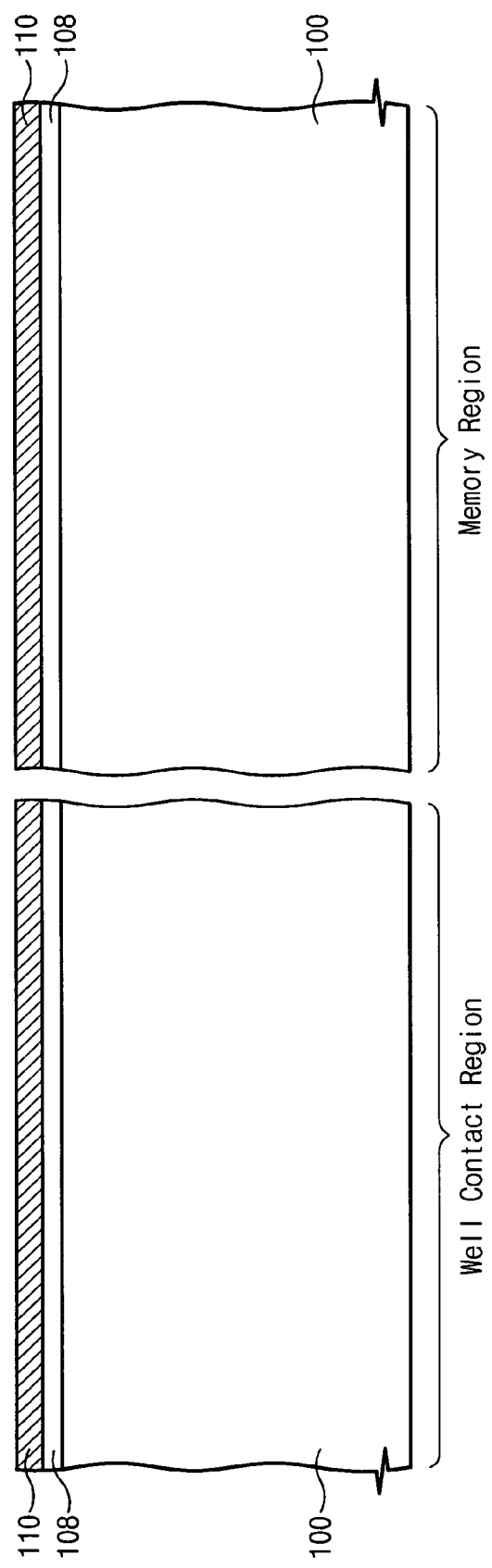
Figure 5B:
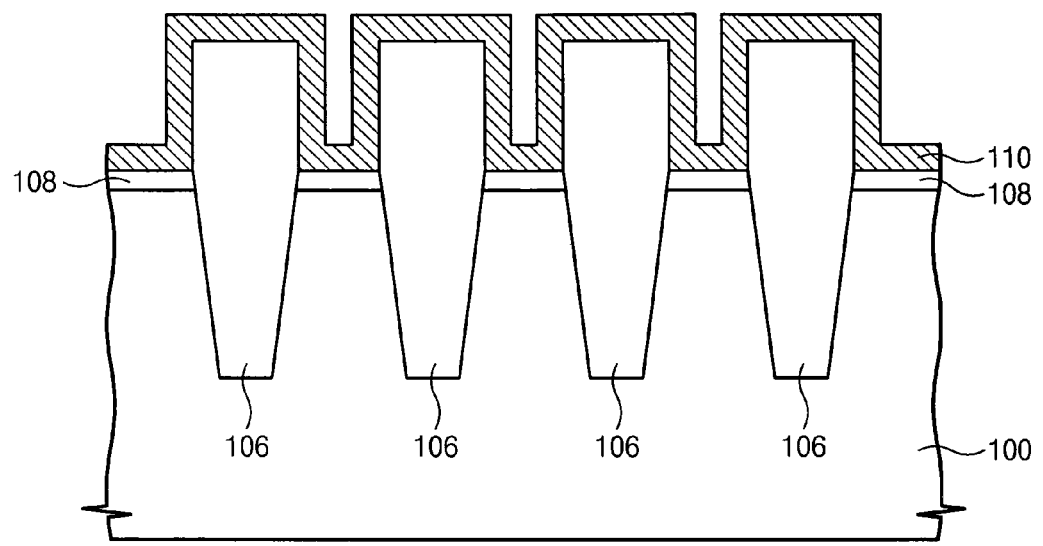

Referring now to FIGS. 5A and 5B, the pad oxide layer 102 and the pad nitride layer 104, which are used as the etch mask, are selectively removed. A gate insulating layer 108 is formed on the exposed substrate 100. In some embodiments of the present invention, the gate insulating layer 108 may include a thermal oxide layer. A buffer conductive layer 110 is formed on the gate insulating layer 108. The buffer conductive layer 110 may reduce the likelihood that an oxide layer is additionally formed on the gate insulating layer 108 in following processes. The buffer conductive layer 110 may include, for example, a conductive material. In particular, in some embodiments of the present invention the buffer conductive layer 110 may include the same material as a floating gate pattern, the formation of which will be discussed below, so that the resistance between the buffer conductive layer 110 and the floating gate pattern may be as low as possible.

Figure 6B:
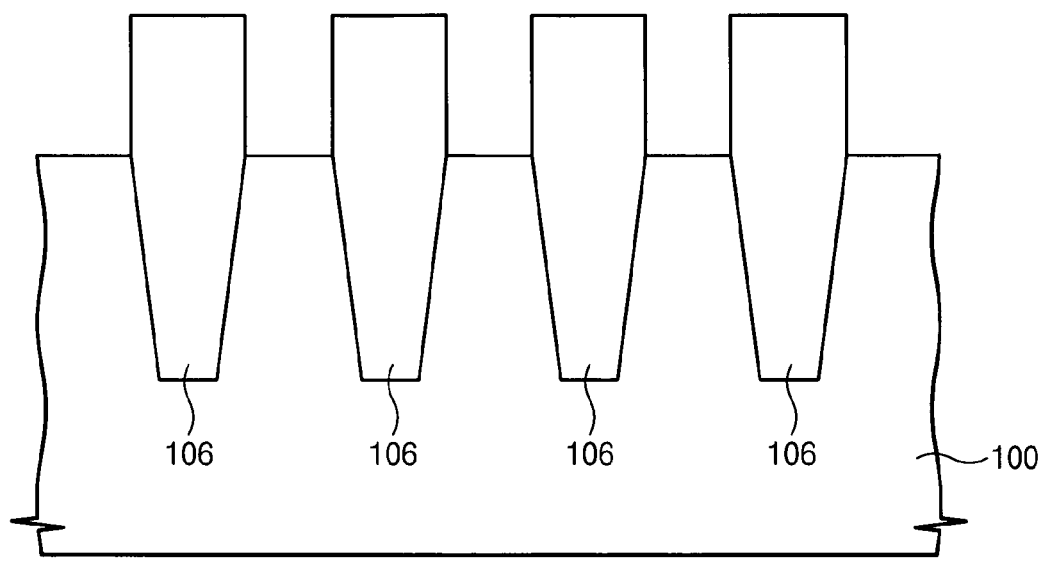

Referring now to FIGS. 6A and 6B, after forming a photoresist pattern (not shown) on the buffer conductive layer 110 and the gate insulating layer 108, an opening 135 is formed using, for example, an etching process. The opening 135 may act as a charge pathway, such that charges generated during a subsequent etching process of the isolation layer 106 may not accumulate in the floating gate pattern, but be discharged into the substrate 100. This opening 135 is provided over the well contact region, such that it is formed under the dummy gate line formed in a subsequent process. In some embodiments of the present invention, the opening 135 may be formed such that its width is equal to or smaller than the width of the dummy gate line.

Figure 7B:
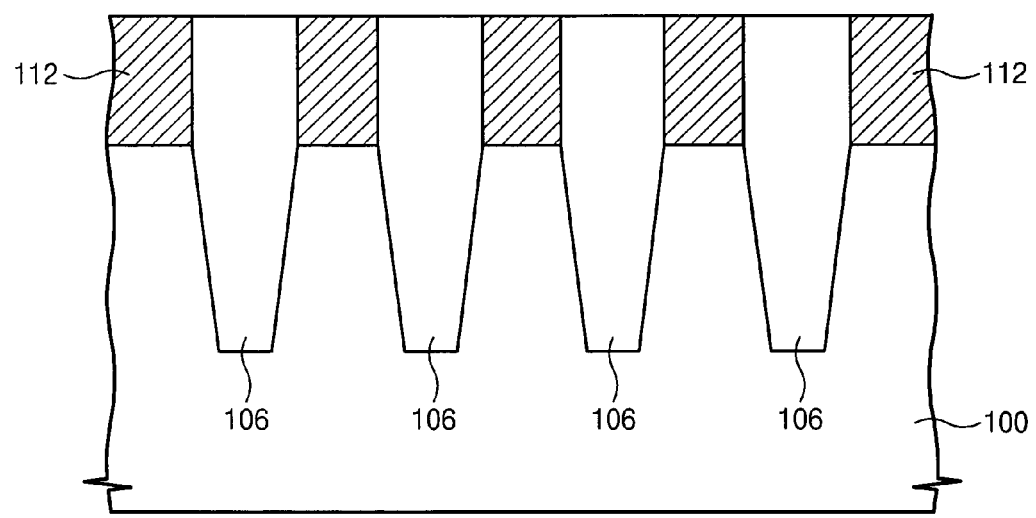

Referring now to FIGS. 7A and 7B, a floating gate pattern 112 is formed on the resultant structure and is planarized using, for example, a chemical mechanical polishing (CMP) process to expose at least a portion of the upper surface of the isolation layer 106. The floating gate pattern 112 may include, for example, a metallic material, doped polysilicon, or the like. The floating gate pattern 112 is provided in the opening 135 and, thus, the floating gate pattern 112 is electrically coupled to the substrate 100 through the opening 135.

In some embodiments of the present invention, processing steps in the fabrication of memory devices discussed above with respect to FIGS. 3A through 7B may be modified by forming the gate insulating layer 108 on the substrate 100 and patterning the gate insulating layer 108 to form the opening 135, which exposes at least a portion of the well contact region of the substrate 100. Thereafter, a conductive layer may be formed on the resultant structure and then the isolation layer may be formed.

Figure 8A:
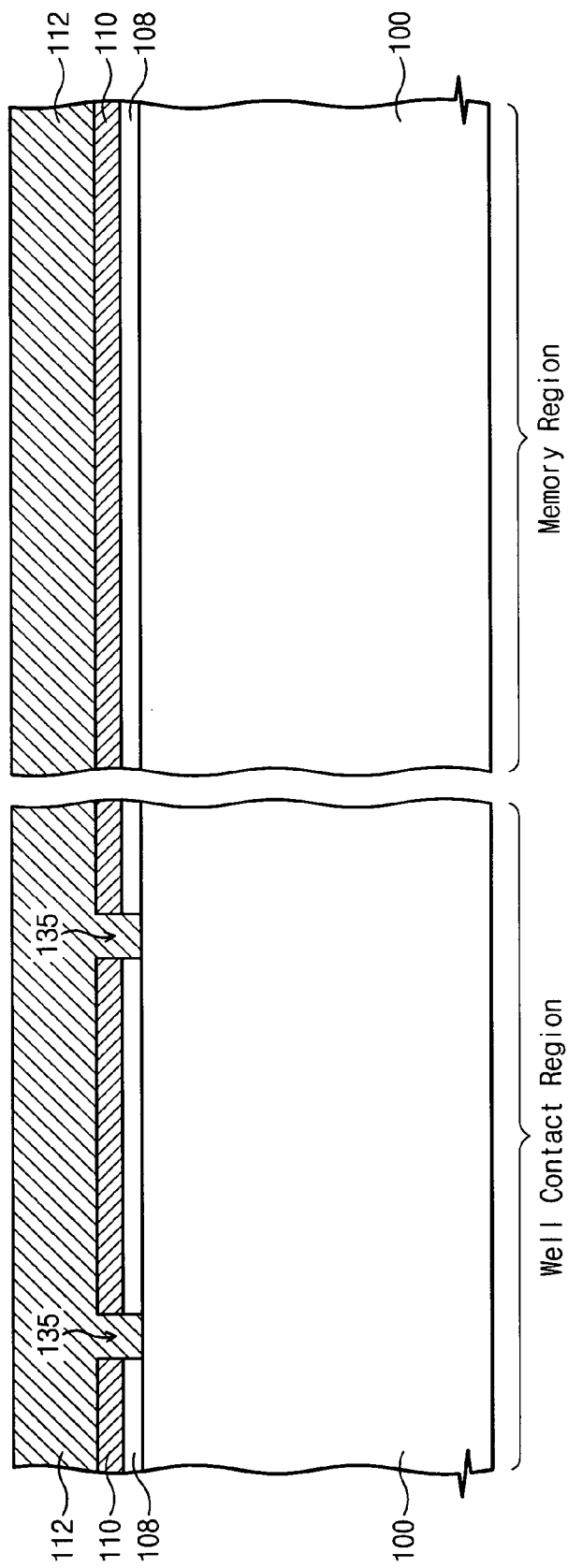
Figure 8B:
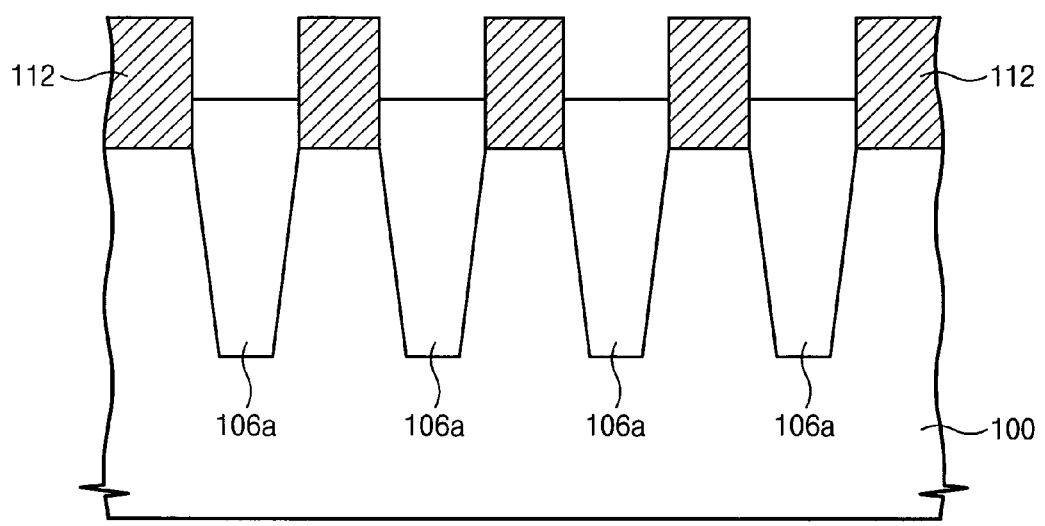

Referring now to FIGS. 8A and 8B, a first etching process is performed to remove at least a portion of the isolation layer 106. In some embodiments of the present invention, after the first etching process, a surface of the isolation layer 106a may be higher than an upper surface of the gate insulating layer 108 formed on the substrate 100. The first etching process may be performed using, for example, a dry etching process or a wet etching process.

Figure 9B:
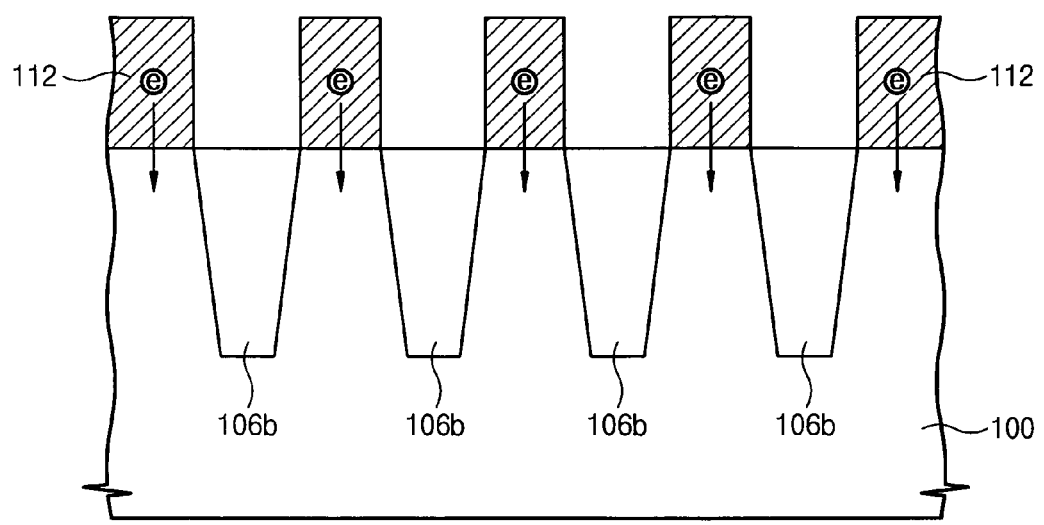

Referring to now to FIGS. 9A and 9B, a second etching process is performed on the remaining portion of the isolation layer 106a to expose at least a portion of a side surface of the floating gate pattern 112. At this time, a dry etching process having an anisotropic etching characteristic may be used to reduce the likelihood that the gate insulating layer 108 on the substrate 100 will be etched simultaneously with the isolation layer 106b. In some embodiments of the present invention, the charges generated due to the plasma used in the dry etching process may not be accumulated in the floating gate pattern 112, but discharged into the substrate 100 through the opening 135. Although the opening 135 is formed in the well contact region, charges injected onto the memory region may move into the opening 135 in the well contact region so that the charges may be discharged into the substrate 100 because charges tend to choose the path of least resistance. Therefore, according to some embodiments of the present invention, a breakdown phenomenon may not occur in the gate insulating layer 108 formed on the substrate 100.

Figure 10A:
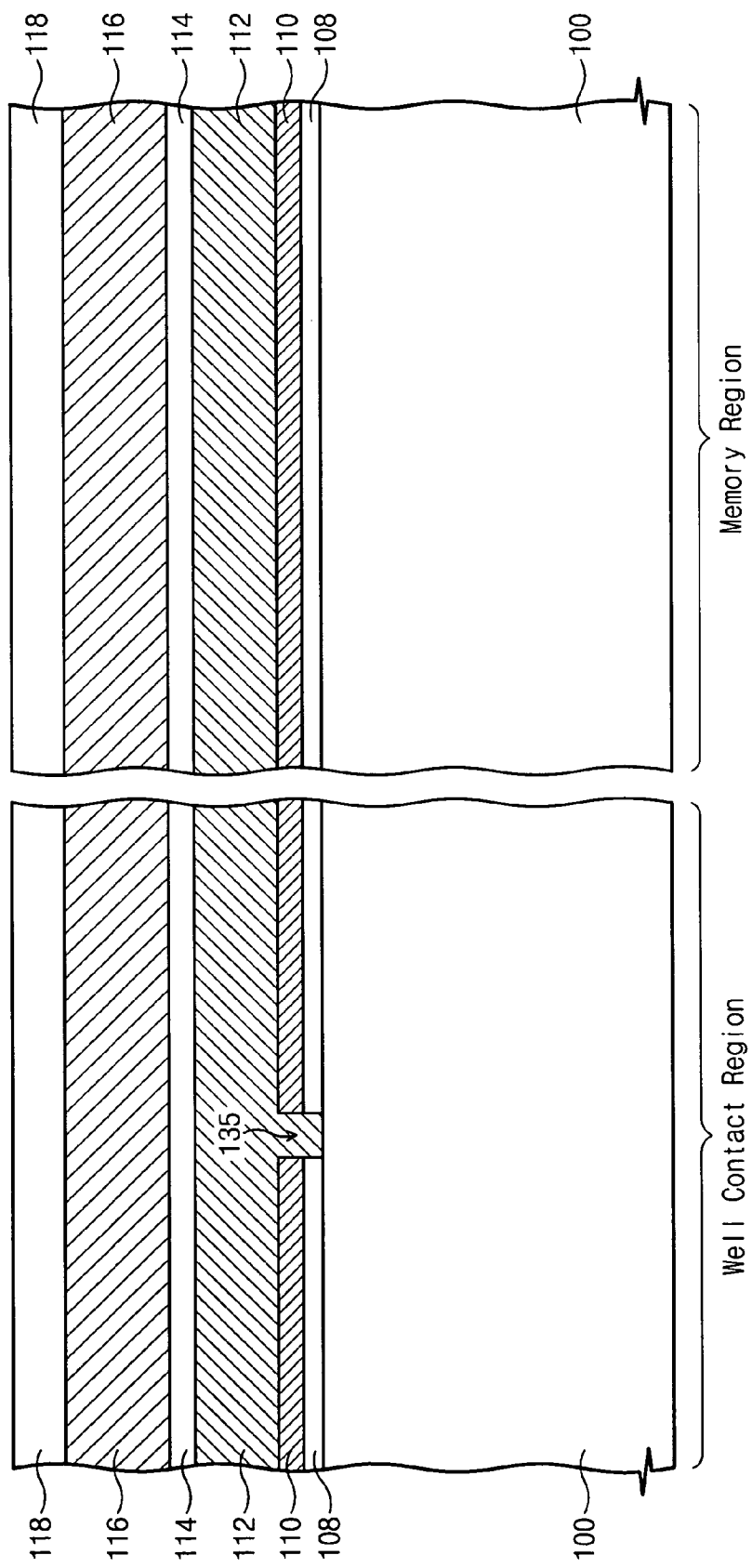
Figure 10B:
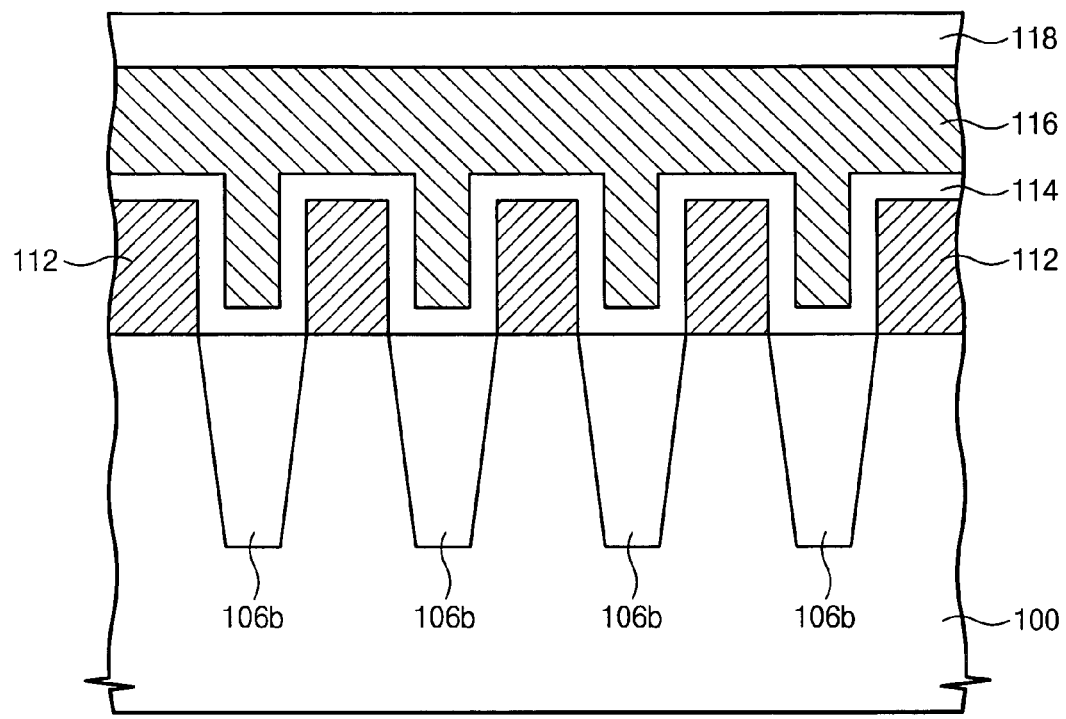

Referring now to FIGS. 10A and 10B, a dielectric layer 114 and a conductive layer 116 are formed on the resultant structure. The dielectric layer 114 may include, for example, oxide-nitride-oxide (ONO) layer. A hard mask layer 118 is formed on the conductive layer 116. The hard mask layer 118 is used as an etch mask for etching the conductive layer 116 for forming a control gate, the dielectric layer 114 and the floating gate pattern 112.

Figure 11B:
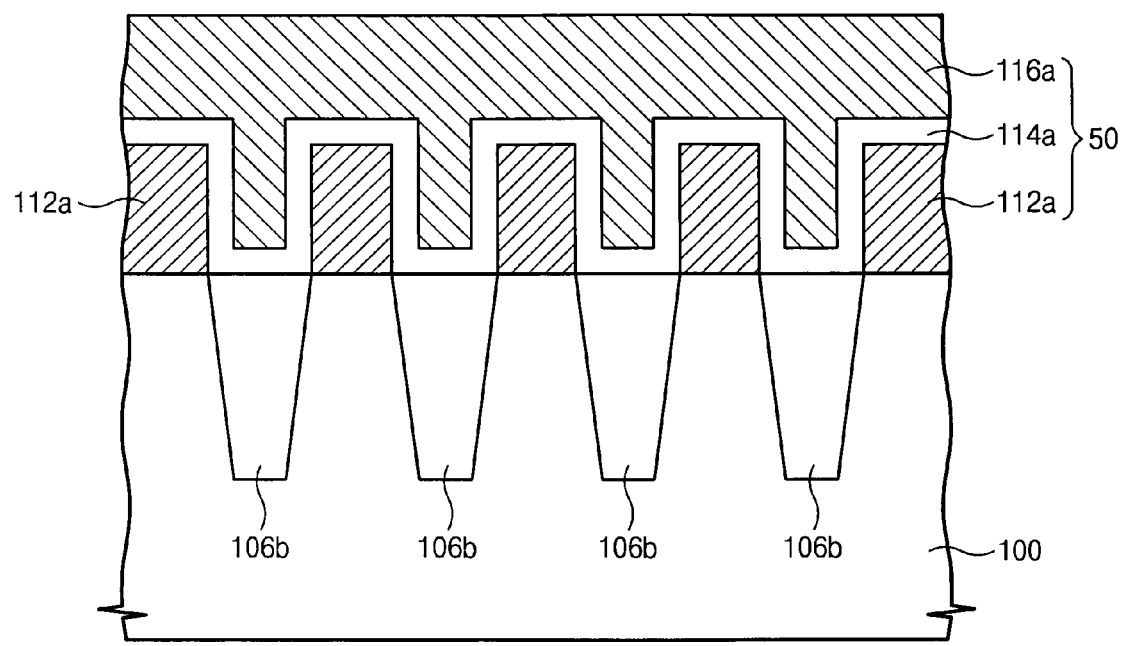

Referring now to FIGS. 11A and 11B, a photoresist pattern (not shown) is formed on the hard mask layer 118, and the overlying layers 116, 114, 112 and 110 on the gate insulating layer 108 are etched into a predetermined configuration using a hard mask (not shown) formed by the photoresist pattern, to thereby form the dummy gate line 50, a ground select line 54 and the plurality of word lines 56a and 56b. At this time, the gate insulating layer 108 acts as an etch barrier layer. After forming a mask on the well contact region, an ion implantation process is performed over the memory region to form source/drain regions 140. Although not illustrated in the Figures, after an interlayer insulating layer is formed and a contact hole is formed, processing steps for connecting the source region of the ground select line 54 to a common source line 52 are performed. Although it is illustrated as if a floating gate 112a and the control gate 116a of the ground select line 54 are spaced apart from each other through the dielectric layer 114a, in some embodiments of the present invention, the floating gate 112a and the control gate 116a may be electrically connected to each other.

As illustrated in the figures, the opening 135 extending through the buffer conductive layer 110 and the gate insulating layer 108 is formed under the dummy gate line 50 formed on the well contact region, such that the dummy gate line 50 is electrically connected to the substrate 100 through the opening 135. As discussed above, since the dummy gate line 50 does not operate as a memory cell, there may not be a problem in operating the memory device even if the substrate 100 is electrically connected to the dummy gate line 50. Furthermore, the ground select line 54 and the plurality of the word lines 56A and 56B formed on the substrate 100 incorporating the memory region, are electrically isolated from the substrate 100 by the gate insulating layer 108. Therefore, the floating gate 112a operates as a memory cell, which functions as a data recording layer.

Figure 12:
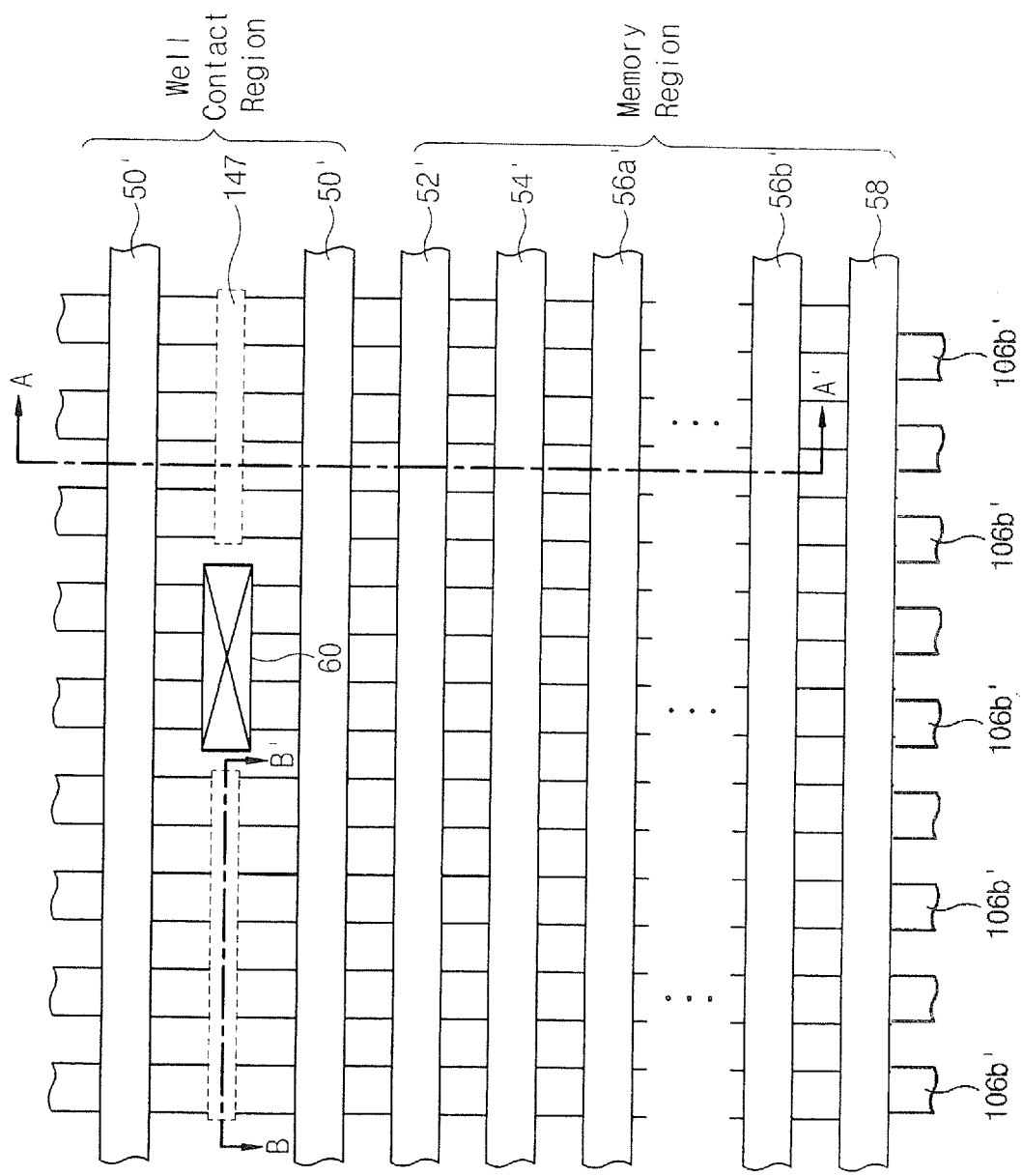
FIG. 12 is a plan view of nonvolatile memory devices according to further embodiments of the present invention.

Referring now to FIG. 12, a plan view of nonvolatile memory devices according to further embodiments of the present invention will be discussed. As illustrated in FIG. 12, an opening 145, which is used as a charge pathway during an etching process of an isolation layer, is not formed under a dummy gate line 50', but it is formed on an active region between the dummy gate lines 50'. The opening 145 is used as the opening 145 only during the etching process of the isolation layer and, thereafter, it remains as a concavity 147 (FIG. 16B) on an active region of a well contact region, whereas the opening 135 discussed above with respect to FIGS. 3A through 11B remains under the dummy gate line 50 after all the processes are completed.

Referring now to the cross-sections of FIGS. 13A to 16B, processing steps in the fabrication of nonvolatile memory devices according to further embodiments of the present invention will be discussed. FIGS. 13A through 16A are cross-sections taken along the line A-A' of FIG. 12 and FIGS. 13B through 16B are cross-sections taken along the line B-B' of FIG. 12. The processing steps discussed above with respect to FIGS. 3A through 5B are performed and, therefore, the details of these processing steps will not be discussed in detail herein. In particular, an etch mask is formed on a substrate 100' and the substrate 100' is patterned to form a trench therein. Thereafter, an oxide layer is formed in the trench to form an isolation layer 106'. After removing the etch mask, a gate insulating layer 108' and a buffer conductive layer 110' are formed on the resultant structure, and they are patterned to form an opening 145. At this time, the opening 145 is formed on the active region except a portion under the dummy gate line, which will be formed later. However, this opening 145 may be simultaneously formed under the dummy gate line as well as on the active region.

Figure 13A:
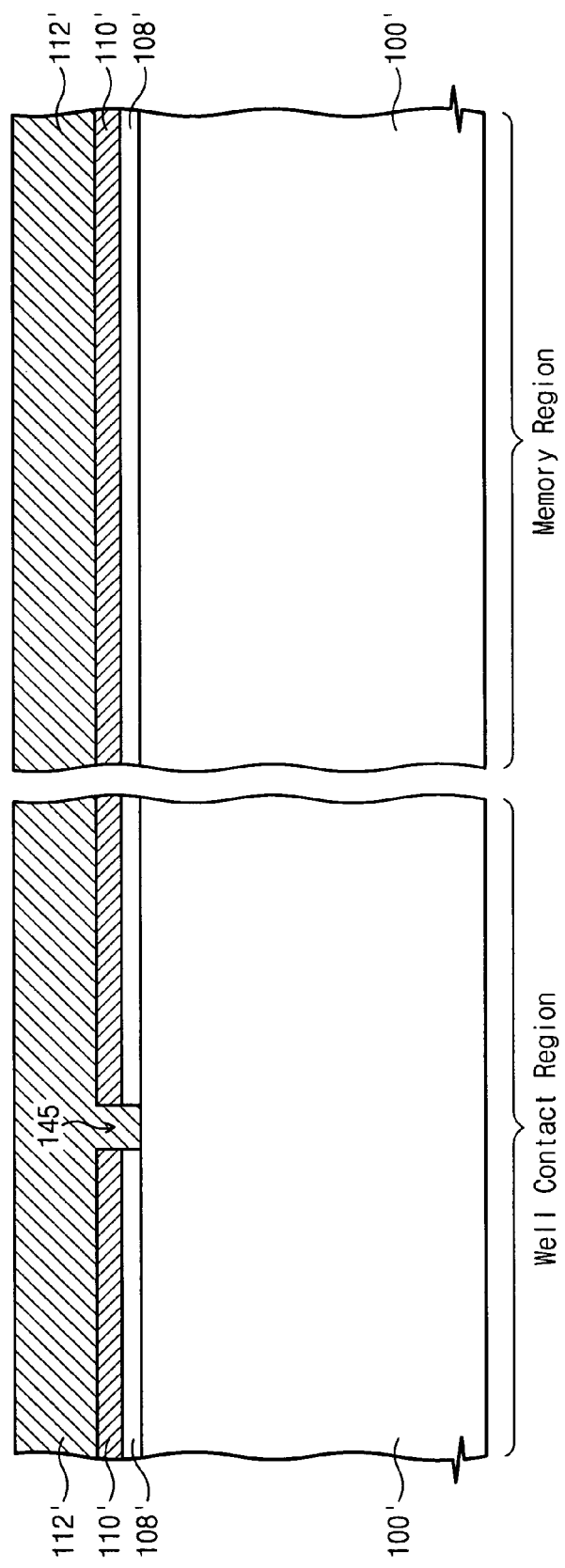
Figure 13B:
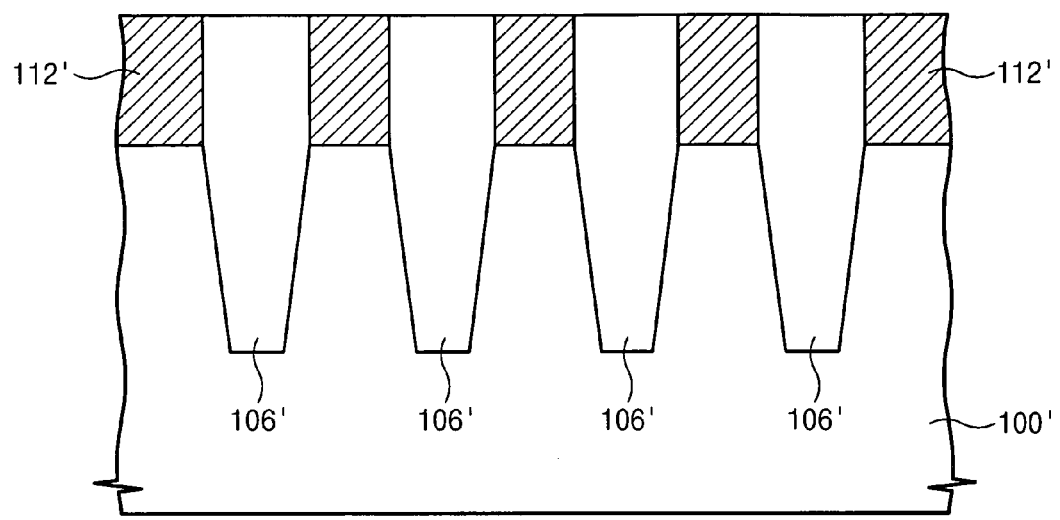

Referring now to FIGS. 13A and 13B, a floating gate pattern 112' is formed on the resultant structure. The floating gate pattern 112' includes, for example, a conductive material. Furthermore, the floating gate pattern 112' may be electrically connected to the substrate 100' through the opening 145.

Figure 14B:
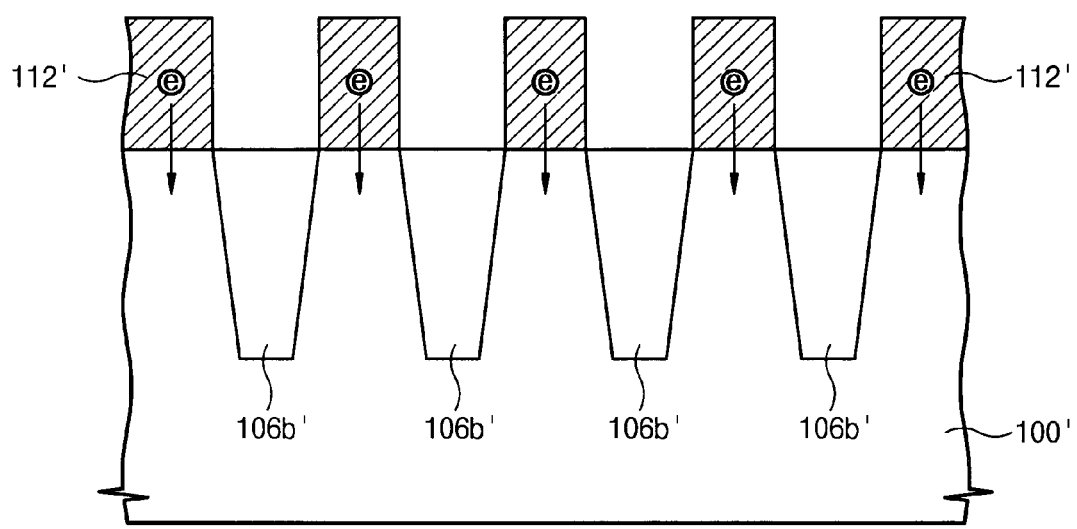
Figure 15A:
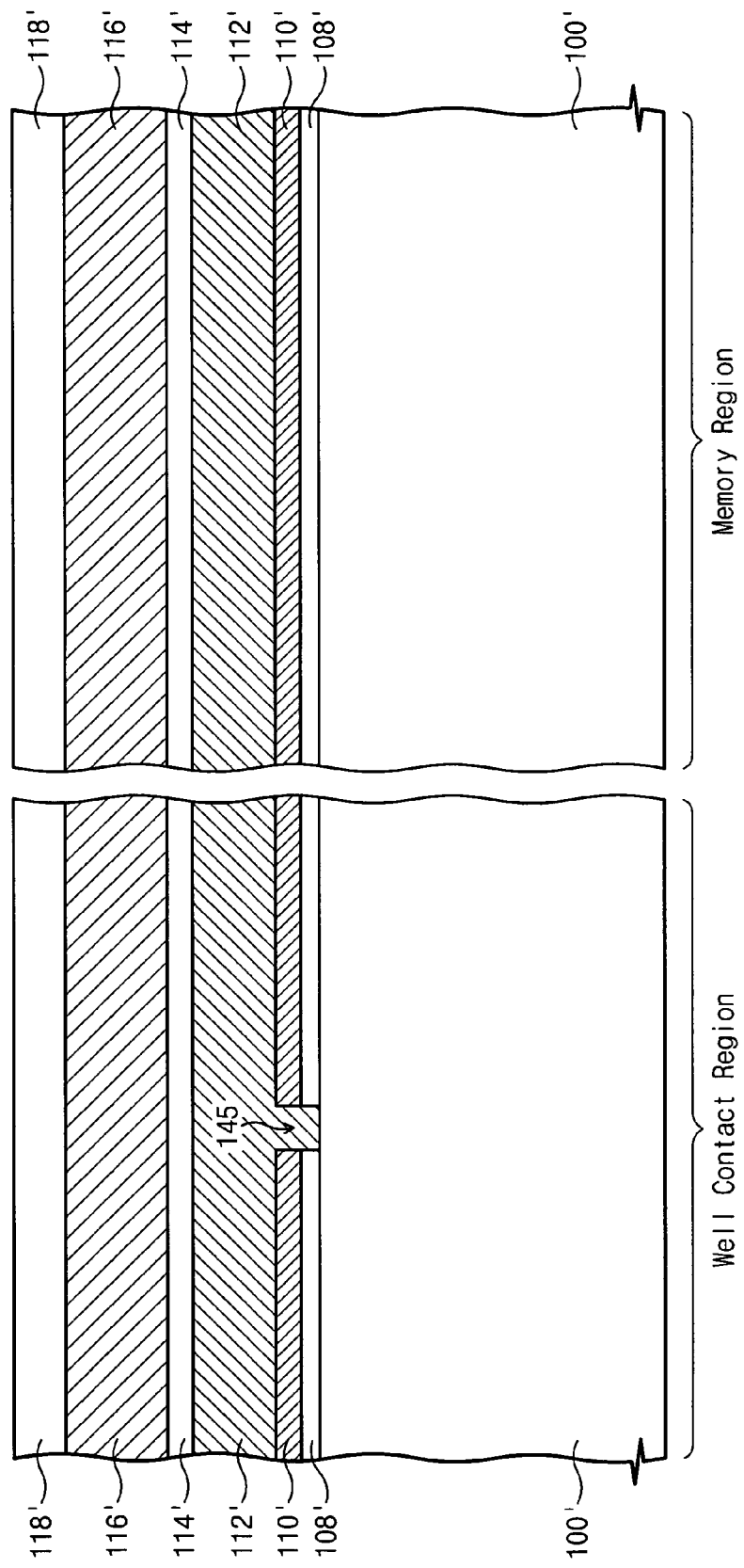
Figure 15B:
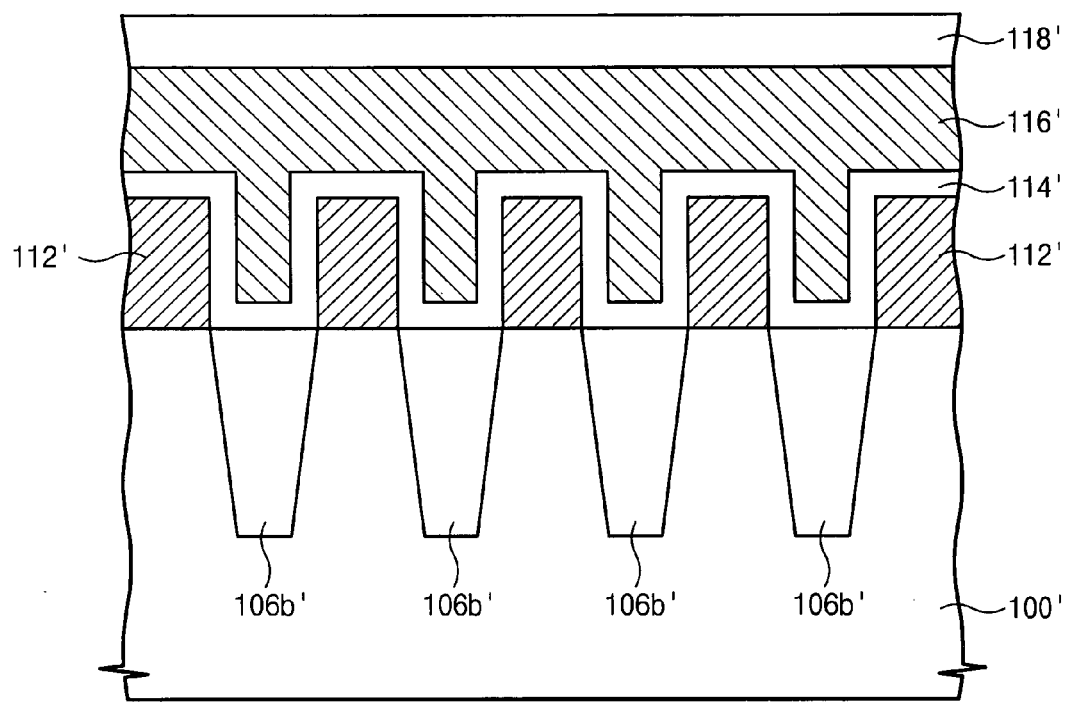

Referring now to FIGS. 14A and 14B, charges generated in etching the isolation layer 106' are not accumulated in the floating gate pattern 112', but discharged into the substrate 100' through the opening 145. Therefore, it may be possible to reduce the likelihood that the breakdown phenomenon will be induced in the gate insulating layer 108'. Referring now to FIGS. 15A and 15B, a dielectric layer 114' and a conductive layer 116' are formed on the resultant structure in sequence, and then a hard mask layer 118' is formed on the conductive layer 116'. The hard mask layer 118' is used as an etch mask for etching the conductive layer 116', the dielectric layer 114' and the floating gate pattern 112'.

Figure 16A:
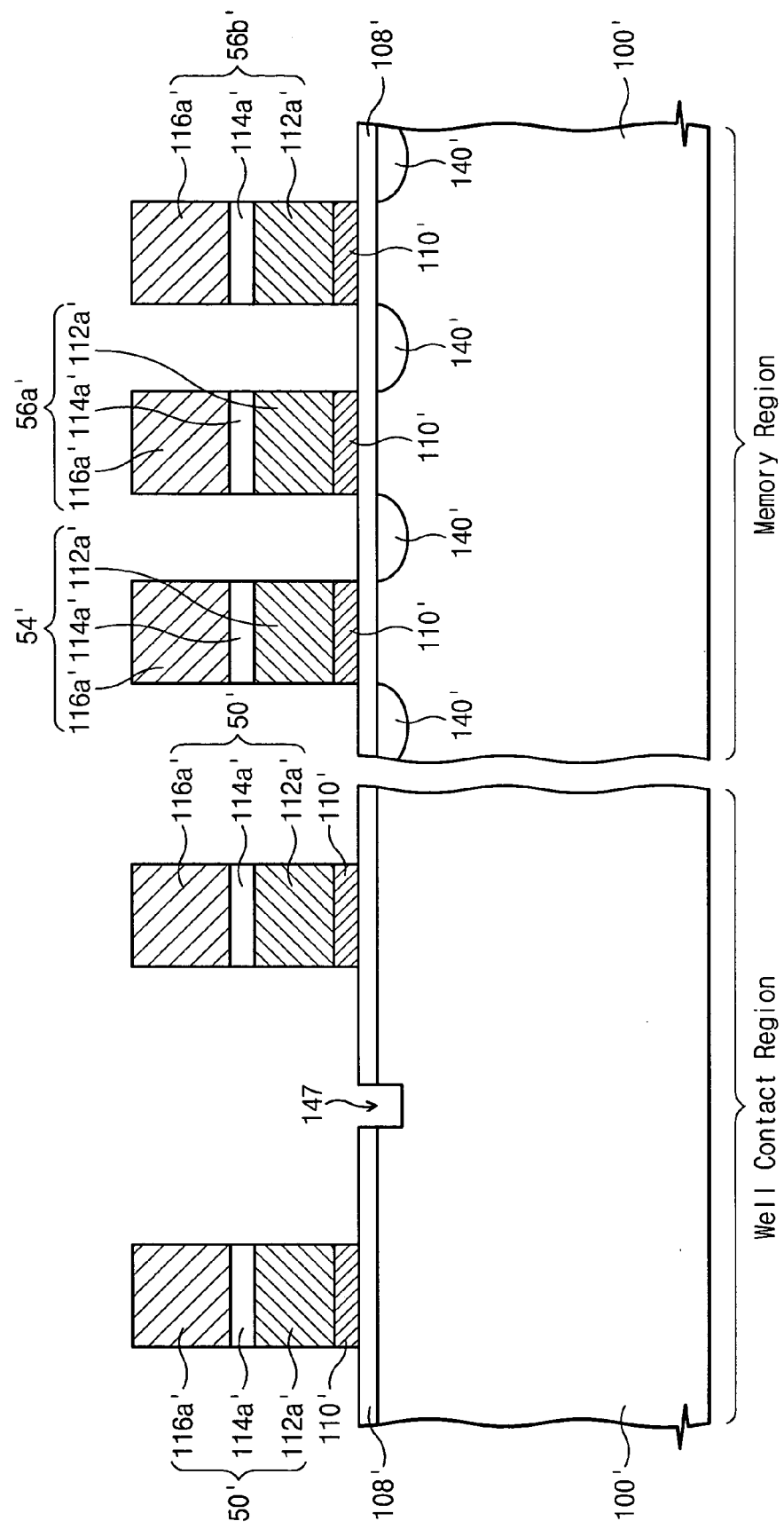
Figure 16B:
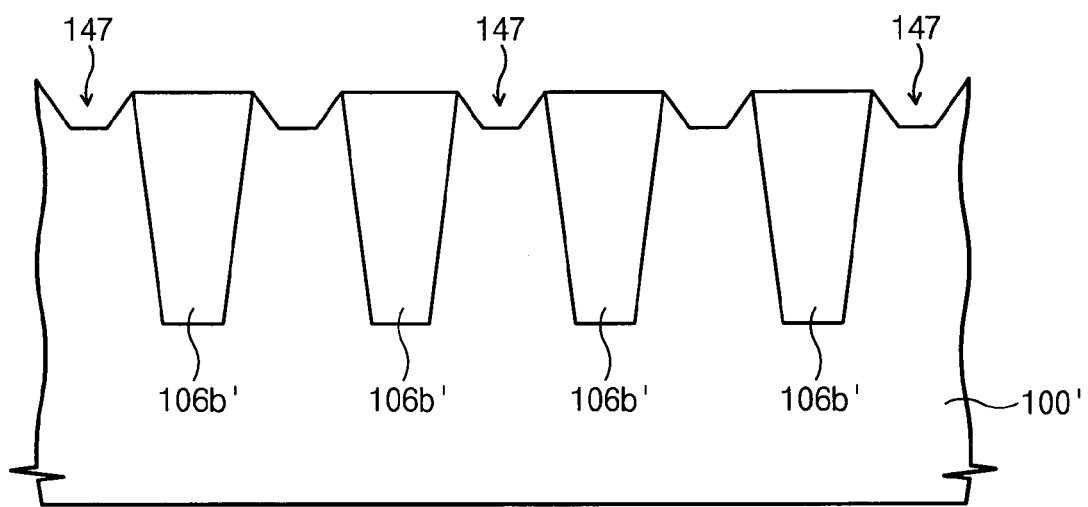

Referring now to FIGS. 16A and 16B, a photoresist pattern (not shown) is formed on the hard mask layer 118' and the overlying layers 116', 114', 112' and 110' on the gate insulating layer 108' are etched using a hard mask (not shown) formed by the photoresist pattern, to thereby form a dummy gate line 50', a ground select line 54', and a plurality of word lines 56a' and 56b'. The gate insulating layer 108' becomes an etch barrier layer as stated above. However, since the gate insulating layer 108' is not provided on the opening 145, a portion of the substrate 100' incorporating the well contact region is etched such that a portion of the opening 145 remains as a concavity 147. An ion implantation process is performed to form source/drain regions 140'.

According to some embodiments of the present invention, since the charges generated in etching the isolation layer are not accumulated in the floating gate pattern, but discharged into the substrate through the opening, it may be possible to reduce the likelihood that breakdown in the gate insulating layer will occur. Thus, more reliable memory devices may be provided according to some embodiments of the present invention.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A nonvolatile memory device comprising:
   a substrate having a memory region and a well contact region;
   an isolation layer on the substrate that defines an active region of the substrate;
   a gate insulating layer on the substrate, the gate insulating layer defining an opening therein, the opening exposing at least a portion of the well contact region of the substrate and acting as a charge pathway for charges generated during a subsequent etch of the isolation layer;
   a first conductive layer pattern on the gate insulating layer, the first conductive layer pattern having at least a portion of a side surface thereof exposed;
   a dielectric layer pattern on the first conductive layer pattern; and
   a second conductive layer pattern on the dielectric layer pattern, the first conductive layer pattern, the dielectric layer pattern and the second conductive layer pattern providing stacked gate electrodes on the memory region and the well contact region of the substrate.

2. The memory device of claim 1, wherein the opening is under the stacked gate electrode on the well contact region and electrically couples the first conductive layer and the substrate.

3. The memory device of claim 1, wherein the opening is outside of the stacked gate electrode on the well contact region.

4. The memory device of claim 1, further comprising a buffer conductive layer on the gate insulating layer between the gate insulating layer and the first conductive layer pattern, wherein the gate insulating layer and the buffer conductive layer define the opening.

5. The memory device of claim 1, wherein the first conductive layer is electrically coupled to the substrate through the opening.

* * * * *